(12) United States Patent
Kono et al.

(10) Patent No.: US 9,086,634 B2
(45) Date of Patent: Jul. 21, 2015

(54) PRODUCTION METHOD AND EVALUATION APPARATUS FOR MASK LAYOUT

(71) Applicant: Kabushiki Kaisha Toshiba, Minato-ku (JP)

(72) Inventors: Yuko Kono, Tokyo (JP); Kazuyuki Masukawa, Kanagawa-ken (JP); Toshiya Kotani, Tokyo (JP); Chikaaki Kodama, Tokyo (JP); Yasunobu Kai, Kanagawa-ken (JP)

(73) Assignee: Kabushiki Kaisha Toshiba, Minatu-ku (JP)

( * ) Notice: Subject to any disclaimer, the term of this patent is extended or adjusted under 35 U.S.C. 154(b) by 0 days.

(21) Appl. No.: 14/013,213

(22) Filed: Aug. 29, 2013

(65) Prior Publication Data

US 2014/0242498 A1 Aug. 28, 2014

(30) Foreign Application Priority Data

Feb. 26, 2013 (JP) .................................. 2013-036489

(51) Int. Cl.
*G03F 1/70* (2012.01)
*G03F 1/68* (2012.01)

(52) U.S. Cl.
CPC ... *G03F 1/70* (2013.01); *G03F 1/68* (2013.01)

(58) Field of Classification Search
CPC ...................................... G03F 1/68; G03F 1/70
USPC ............................................ 430/5, 30; 716/54
See application file for complete search history.

(56) References Cited

U.S. PATENT DOCUMENTS

| 6,777,147 | B1 * | 8/2004 | Fonseca et al. ................. 430/30 |
| 6,868,355 | B2 | 3/2005 | Ivanovic et al. |
| 8,368,182 | B2 | 2/2013 | Lee et al. |

FOREIGN PATENT DOCUMENTS

| JP | 2007-161906 | 6/2007 |
| JP | 2010-232542 | 10/2010 |
| JP | 2012-181129 | 9/2012 |

* cited by examiner

*Primary Examiner* — Christopher Young
(74) *Attorney, Agent, or Firm* — Oblon, McClelland, Maier & Neustadt, L.L.P.

(57) ABSTRACT

According to one embodiment, a production method for a mask layout of an exposure mask includes evaluating a candidate layout by comparison between an imaged image group and a reference image group. The imaged image group is composed of a plurality of imaged images of patterns formed by performing lithography under a plurality of levels of exposure condition using the candidate layout. The reference image group is composed of a plurality of reference images produced by simulation on assumption of a plurality of levels of the exposure condition.

11 Claims, 13 Drawing Sheets

FIG. 11A −90 nm DEFOCUS

FIG. 11B BEST FOCUS

FIG. 11C +90 nm DEFOCUS

PRODUCTION METHOD AND EVALUATION APPARATUS FOR MASK LAYOUT

CROSS-REFERENCE TO RELATED APPLICATIONS

This application is based upon and claims the benefit of priority from Japanese Patent Application No. 2013-036489, filed on Feb. 26, 2013; the entire contents of which are incorporated herein by reference.

FIELD

Embodiments described herein relate generally to a production method and an evaluation apparatus for a mask layout.

BACKGROUND

In manufacturing an integrated circuit device, a pattern of interconnection and the like is formed by lithography technique. In the lithography technique, the mask layout of an exposure mask is transferred onto a resist film, and this resist film is developed. To this end, an exposure mask is formed so that the pattern of interconnection and the like can be formed as designed.

DETAILED DESCRIPTION

In general, according to one embodiment, a production method for a mask layout of an exposure mask includes evaluating a candidate layout by comparison between an imaged image group and a reference image group. The imaged image group is composed of a plurality of imaged images of patterns formed by performing lithography under a plurality of levels of exposure condition using the candidate layout. The reference image group is composed of a plurality of reference images produced by simulation on assumption of a plurality of levels of the exposure condition.

Embodiments of the invention will now be described with reference to the drawings.

First, a first embodiment is described.

This embodiment is a production method for a mask layout of an exposure mask used to manufacture an integrated circuit device.

Figure 1:
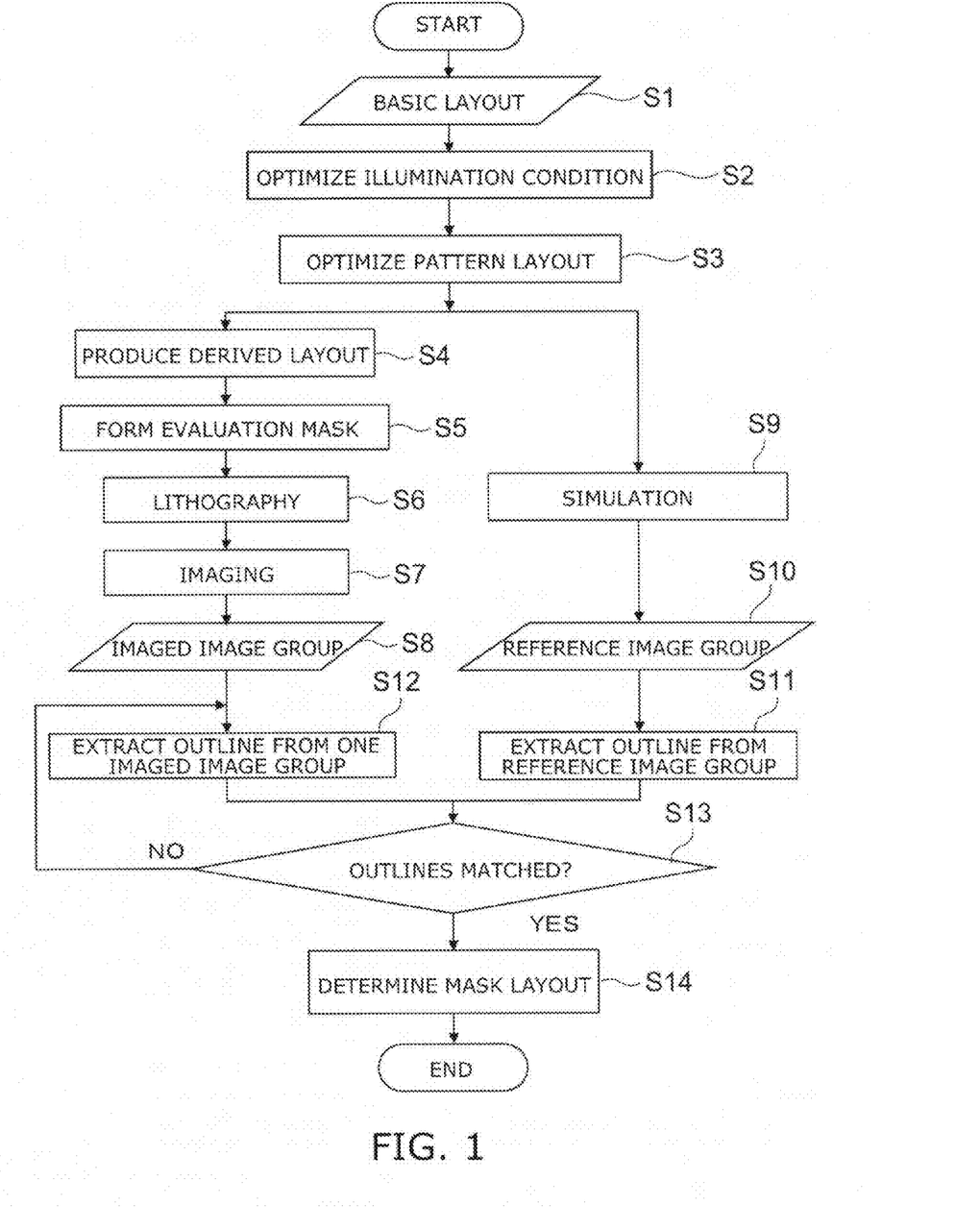
FIG. 1 is a flowchart illustrating a production method for a mask layout according to a first embodiment.
Figure 2:
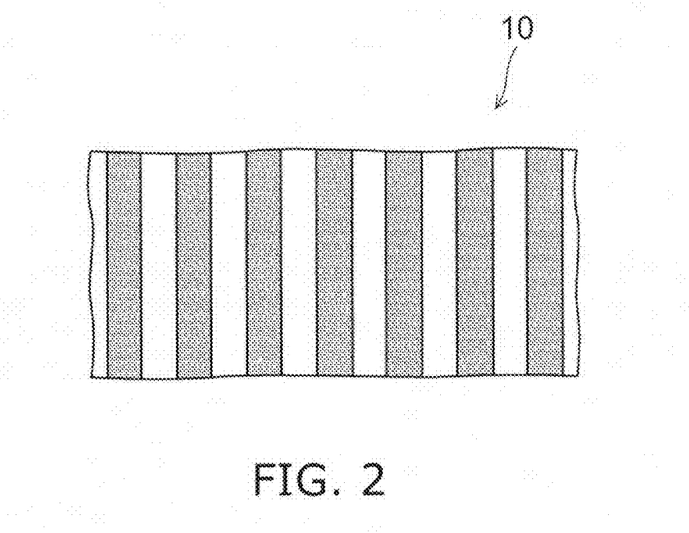
FIG. 2 illustrates a basic layout of a pattern to be formed.

First, as shown in step S1 of FIG. 1 and in FIG. 2, the basic layout of a pattern to be formed in the integrated circuit device is obtained. The basic layout 10 is e.g. a layout of interconnection having the shortest arrangement pitch in the integrated circuit device. In the example shown in FIG. 2, the basic layout 10 is a line-and-space pattern.

Figure 3:
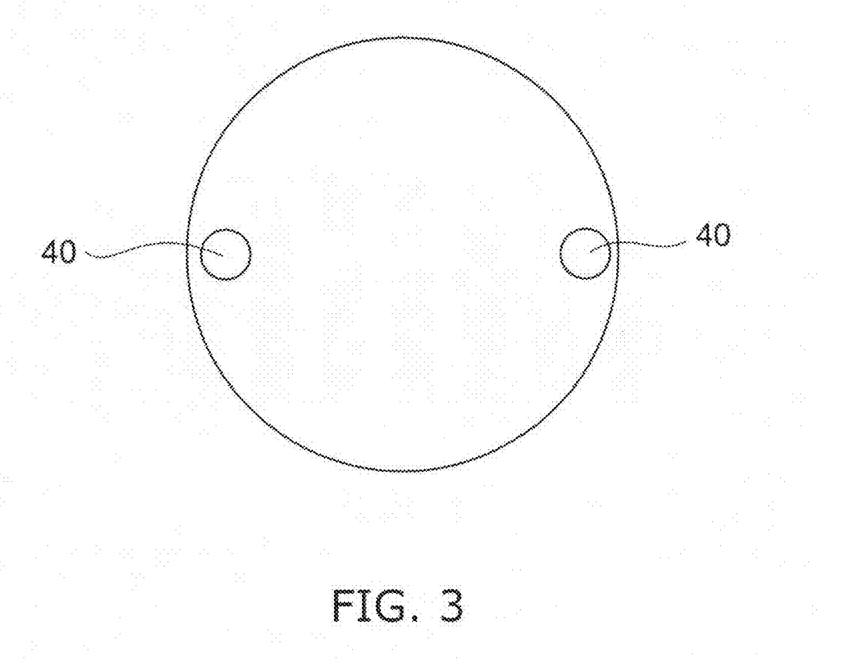
FIG. 3 illustrates an illumination arrangement for exposure.

Next, as shown in step S2 of FIG. 1 and in FIG. 3, the illumination condition is optimized so that the basic layout 10 can be favorably exposed. For instance, light sources 40 are placed in a dipole arrangement suitable for exposure of the line-and-space pattern.

Figure 4A:
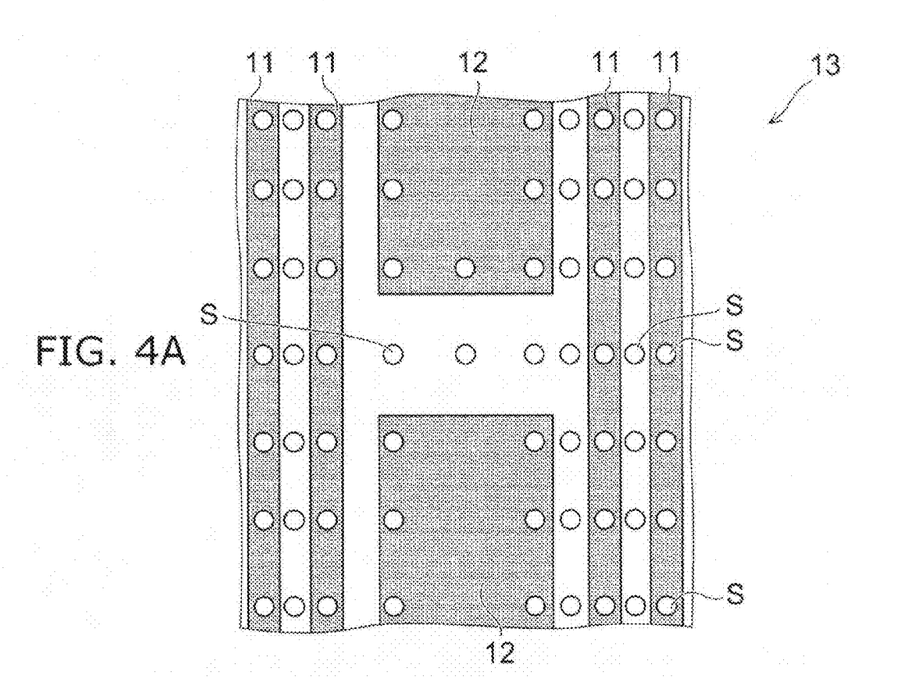
FIG. 4A illustrates a pattern layout before optimization.

Next, as shown in step S3 of FIG. 1, the pattern layout is optimized. Specifically, as shown in FIG. 4A, a pattern layout 13 including wirings 11 and pads 12 is prepared. In the pattern layout 13, a plurality of evaluation points S are defined. Preferably, the evaluation points S are placed intensively at positions where the dimensional variation is expected to be large.

Figure 4B:
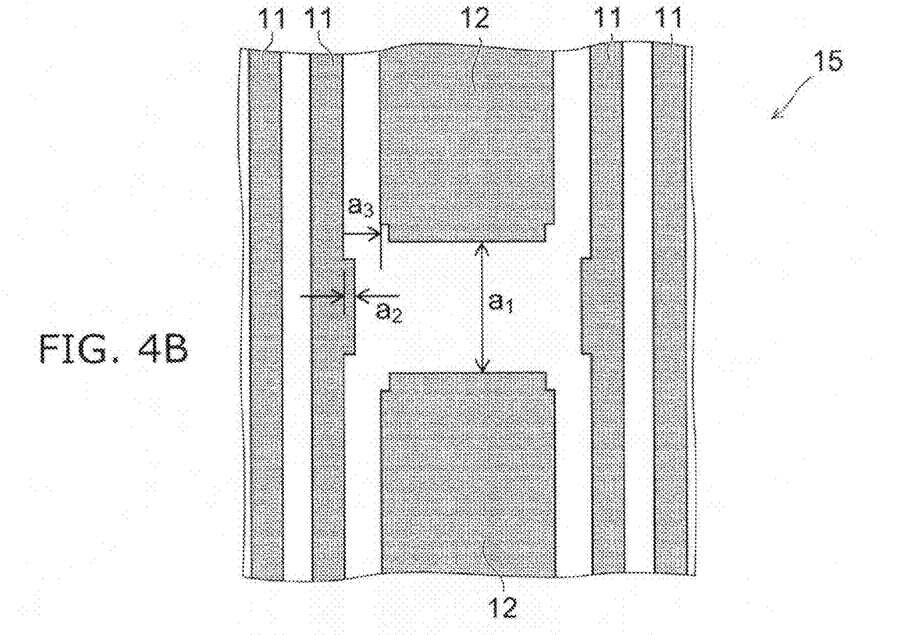
FIG. 4B illustrates a pattern layout after optimization.

Then, as shown in FIG. 4B, for the pattern layout 13, with the connection relation of the circuit maintained, the shape of each portion is deformed so that exposure is improved. This optimization of the pattern layout can be performed by e.g. repeating the modification of the pattern layout by changing parameters $a_1$, $a_2$, $a_3$ and the like representing the variation of the shape of the respective portions from the pattern layout 13, the calculation of the values of indices representing the shape of the pattern obtained by optical simulation, and the evaluation of the shape of the pattern based on these values of indices. For instance, a plurality of indices are combined to produce a cost function. Then, the combination of parameters maximizing or minimizing the value of this cost function is searched. The value of the index is calculated at each evaluation point S.

Figure 5:
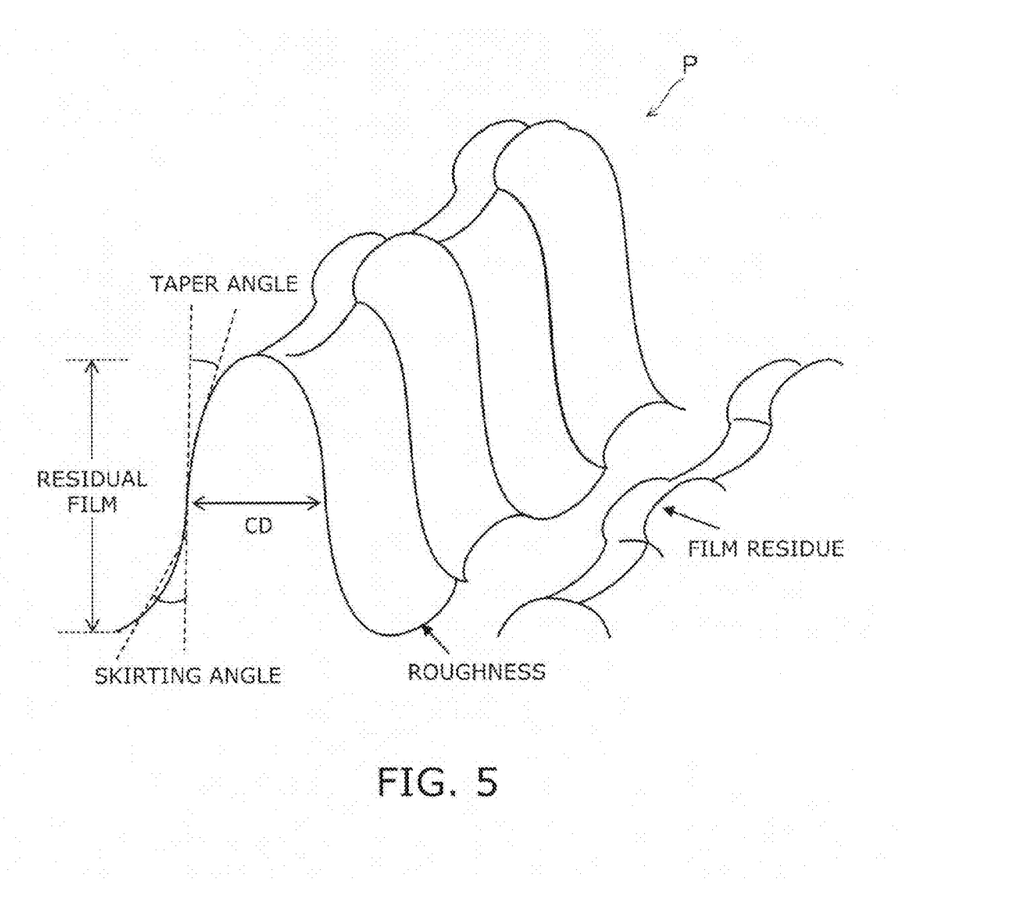
FIG. 5 is a perspective view illustrating indices representing shape of the pattern.

As shown in FIG. 5, the indices representing the shape of the pattern P include e.g. "amount of residual film", "taper angle", "skirting angle", "CD (critical dimension)", "roughness", and "amount of film residue". The "amount of residual film" refers to the height of the pattern in the region where the pattern is to be formed. The amount of residual film needs to be more than or equal to a certain value. If the amount of residual film is too small, "film thickness reduction" occurs, i.e., the height of the pattern is locally lowered. The "taper angle" is the inclination angle of the side surface of the pattern upper portion with respect to the vertical plane. The taper angle needs to be less than or equal to a certain value. If the taper angle is too large, the aforementioned "film thickness reduction" occurs. The "skirting angle" is the inclination angle of the side surface of the pattern lower portion with respect to the vertical plane. The skirting angle needs to be less than or equal to a certain value. If the skirting angle is too large, "skirting" occurs, i.e., the skirt of the pattern spreads.

The "CD" is the width of e.g. the central portion in the height direction of the pattern. The CD needs to fall within a certain range. The "roughness" is the vertical variation along the longitudinal direction of the pattern at the upper surface or skirt of the pattern. It is preferable that the roughness be smaller. If the roughness is too large, defects such as short or open circuit occur. Furthermore, the stability (robustness) of the shape against the variation of the optical condition is decreased. The "amount of film residue" is the residual height of the pattern in the region where the pattern is not to be formed. The amount of film residue needs to be zero at a specific position. For instance, if a sidelobe not to be transferred is transferred, the amount of film residue becomes positive in this region. If a region having a positive amount of film residue is continuously placed in the space between the wirings, short circuit may occur.

Thus, the layout obtained by optimizing the parameters $a_1$, $a_2$, $a_3$ and the like starting from the pattern layout 13 is referred to as "standard layout 15". The standard layout 15 is a lithography target to be actually formed on a wafer by lithography.

Subsequently, originating from the standard layout 15, a sequential process for actually forming a pattern on a wafer and imaging the pattern (steps S4-S8), and a sequential process for performing simulation on the assumption of the standard layout 15 and producing an image of the pattern (steps S9-S10), are performed in parallel. Then, by comparison between the outlines of the images obtained by the two processes (steps S11-S13), a mask layout to be finally adopted is determined (step S14). In the following, details on each process are described.

First, the process for actually forming a pattern is described.

Figure 6A:
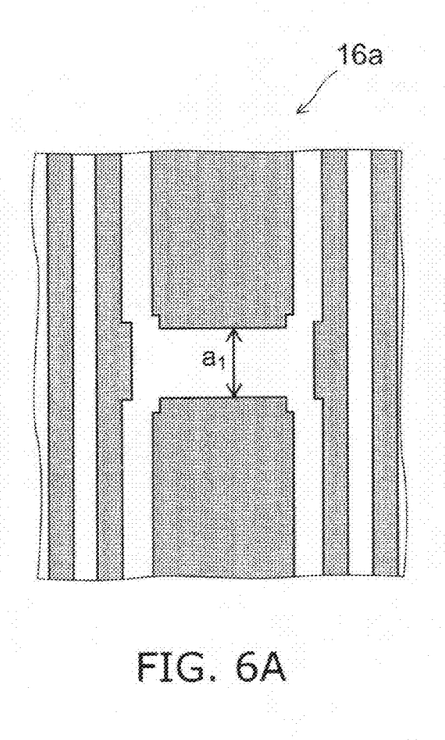
FIGS. 6A to 6C illustrate derived layouts in which the shape of a lithography target is changed with respect to a standard layout.
Figure 6B:
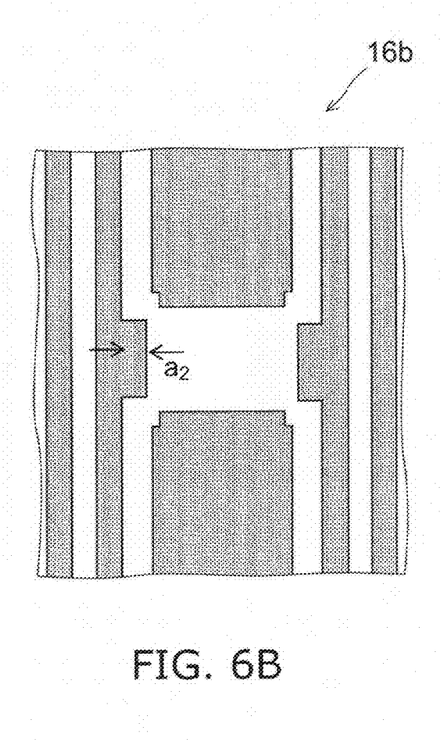
Figure 6C:
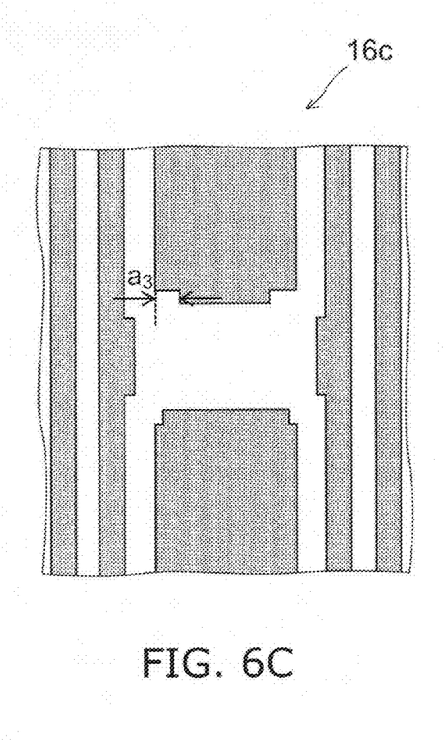

As shown in step S4 of FIG. 1, derived layouts are produced by changing part of the parameters representing the standard layout 15. For instance, as shown in FIGS. 6A to 6C, centering on the standard layout 15, the parameters $a_1$, $a_2$, $a_3$ are independently changed according to a certain rule. Thus, derived layouts 16a-16c are produced in which the lithography target itself to be formed on a wafer is changed.

Next, as shown in step S5 of FIG. 1, the standard layout 15 and the derived layouts 16a-16c (hereinafter collectively referred to as "candidate layouts") are subjected to OPC (optical proximity correction) processing to form an evaluation mask corresponding to each candidate layout after OPC processing. Here, one candidate layout may be formed on one evaluation mask. Alternatively, a plurality of candidate layouts may be formed on one evaluation mask.

Next, as shown in step S6, the evaluation mask with each candidate layout formed thereon is used to perform lithography with the exposure condition such as defocus amount set to a plurality of different levels. Thus, patterns are formed on a wafer. More specifically, a to-be-processed film is formed on a wafer. A resist film is formed thereon. This resist film is exposed using an evaluation mask. Next, the resist film is developed to form a resist pattern. Next, the resist pattern is used as a mask to perform anisotropic etching. Thus, the to-be-processed film is selectively removed. Accordingly, a pattern is formed on the wafer. Here, the number of candidate layouts is denoted by n, and the number of levels of exposure condition is denoted by m. Then, the number of formed patterns is n×m. In this embodiment, for instance, the defocus amount is used as the exposure condition. The defocus amount is varied in three levels, i.e., −90 nm, 0 nm (best focus), and +90 nm.

Next, as shown in step S7, each pattern is imaged from directly above by e.g. SEM (scanning electron microscope). Thus, a top view imaged image of each pattern as viewed from directly above is obtained.

Next, as shown in step S8, each imaged image is stored as electronic data in a storage means. Here, for each candidate layout, m imaged images corresponding to m levels of exposure condition are stored as one imaged image group. Thus, n imaged image groups each composed of m imaged images are stored in the storage means.

Next, a process for performing simulation is described.

First, as shown in step S9, the standard layout 15 is subjected to OPC processing. Then, simulation is performed on the assumption of a plurality of different levels of exposure condition. Here, the exposure condition varied in a plurality of levels is made identical to the exposure condition set to a plurality of different levels in step S6. For instance, the defocus amount is used as the exposure condition. The levels of exposure condition in step S9 are preferably matched with the levels of exposure condition in step S6. Thus, the three-dimensional shape of the pattern formed by lithography is estimated.

For instance, the light intensity distribution of the optical image is estimated by simulation. The constant height surface of light intensity of this optical image is regarded as the outer surface of the pattern to estimate the three-dimensional shape of the pattern. Based on this three-dimensional shape, a two-dimensional image of the top view of the pattern as viewed from directly above is produced and used as a reference image.

Figure 7A:
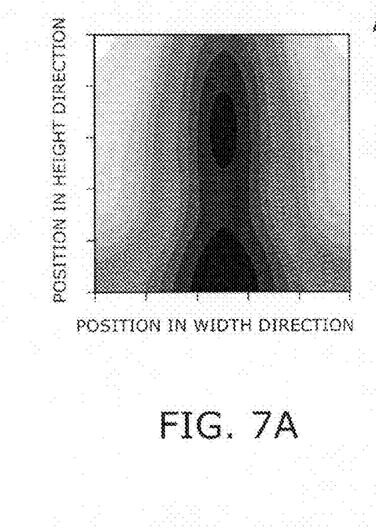
FIG. 7A illustrates a light intensity distribution of an optical image with a large amount of mismatch from an ideal pattern.
Figure 7B:
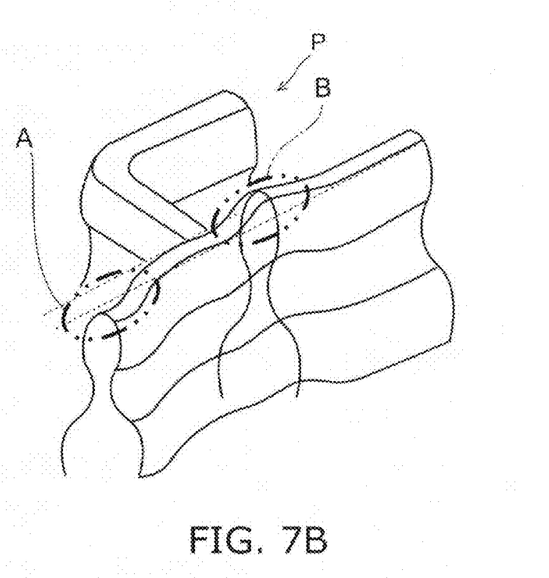
FIG. 7B is a perspective view illustrating the pattern formed in that case.
Figure 7C:
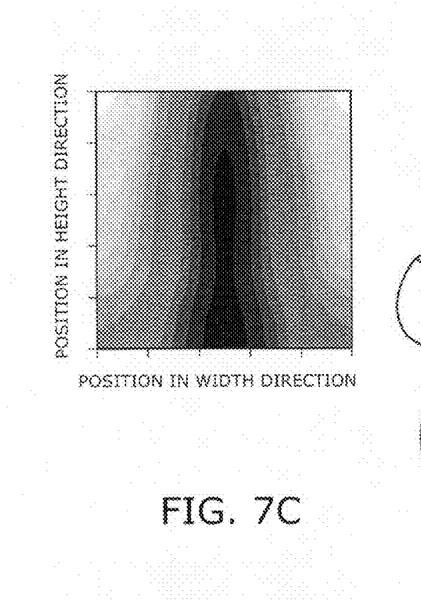
FIG. 7C illustrates the light intensity distribution of an optical image with a small amount of mismatch from the ideal pattern.
Figure 7D:
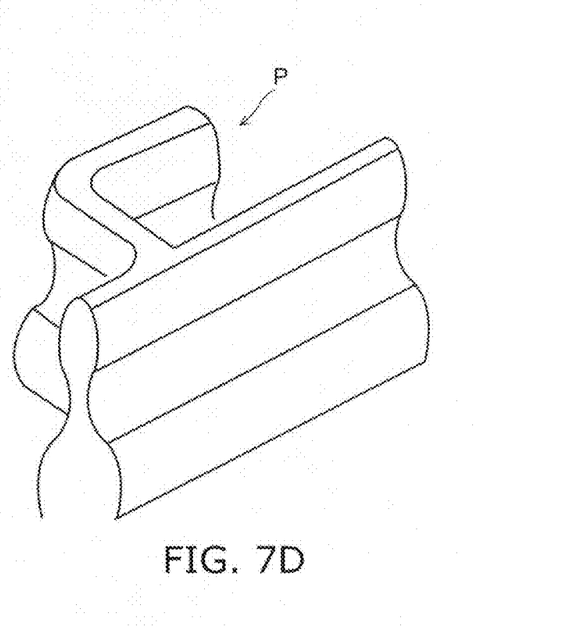
FIG. 7D is a perspective view illustrating the pattern formed in that case.

For instance, as shown in FIG. 7A, the amount of mismatch may be large between the constant height surface of the light intensity distribution in the optical image at exposure time and the outer surface of the ideal pattern. Then, as shown in FIG. 7B, the shape of the pattern P is made non-uniform. For instance, in region A, the pattern P is thin as viewed from above. However, in region B, the pattern P is thick as viewed from above. On the other hand, as shown in FIG. 7C, the amount of mismatch may be small between the constant height surface of the light intensity distribution and the outer surface of the ideal pattern. Then, as shown in FIG. 7D, the shape of the pattern P is made uniform. Thus, a plurality of reference images corresponding to the respective levels of exposure condition are obtained. In the case where the number of levels of exposure condition is m, the number of reference images is m. The reference image is a top view image of the pattern as viewed from above.

Next, as shown in step S10, each reference image is stored as electronic data in the storage means. Here, m reference images corresponding to m levels of exposure condition are stored as one reference image group. If the number of standard layouts 15 is one, one reference image group is stored in the storage means.

Figure 8:
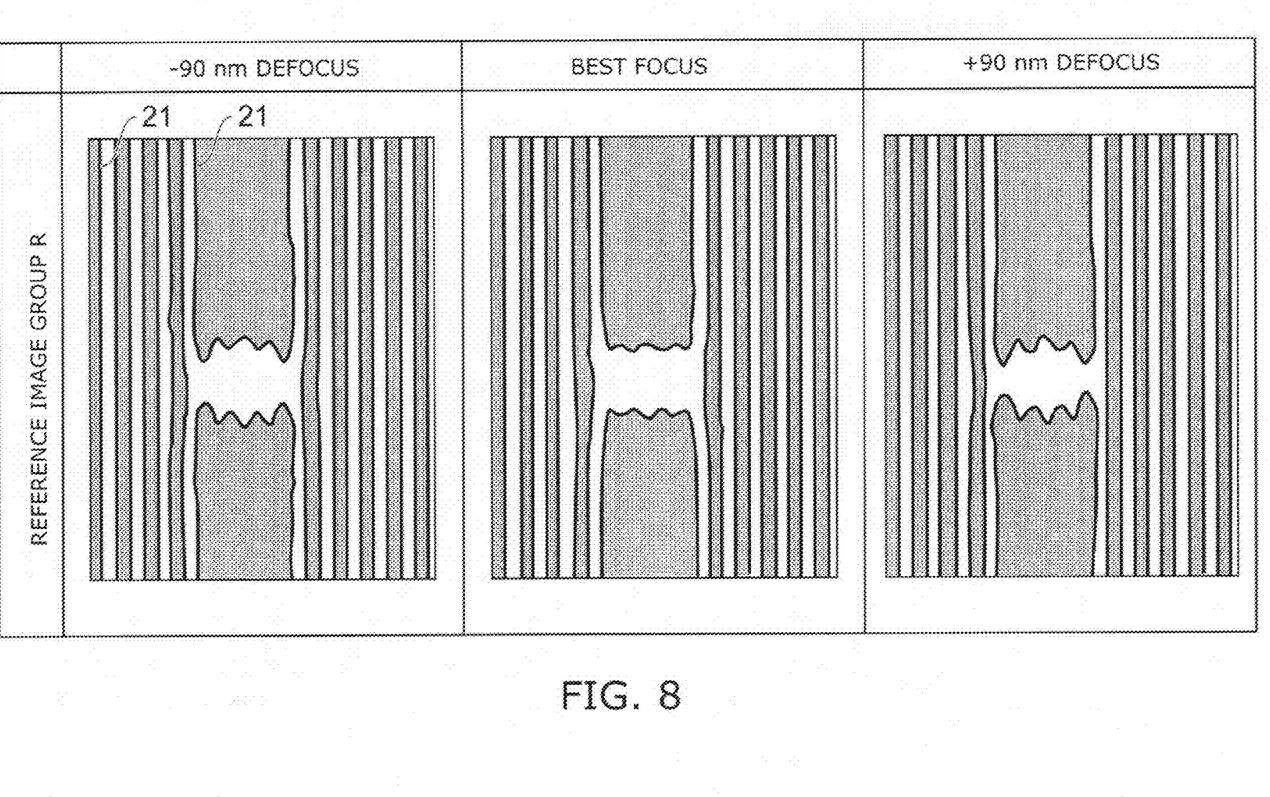
FIG. 8 shows an outline of a pattern extracted from the reference image.

Next, as shown in step S11 and FIG. 8, the outline 21 of the pattern is extracted from each reference image belonging to the reference image group R.

Figure 9A:
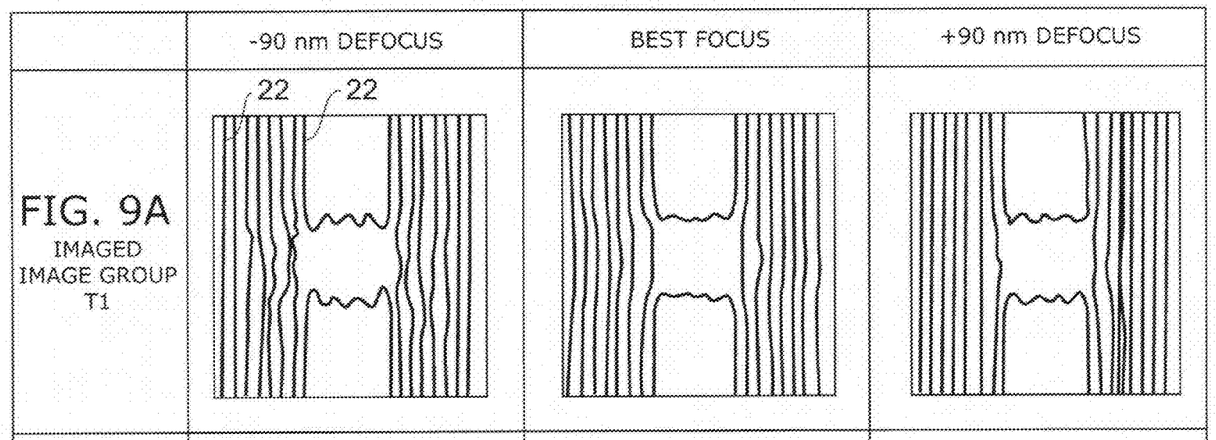
FIGS. 9A and 9B show outlines of a pattern extracted from the imaged image.

Next, as shown in step S12 and FIG. 9A, the outline 22 of the pattern is extracted from each imaged image belonging to one imaged image group T1.

Figure 10A:
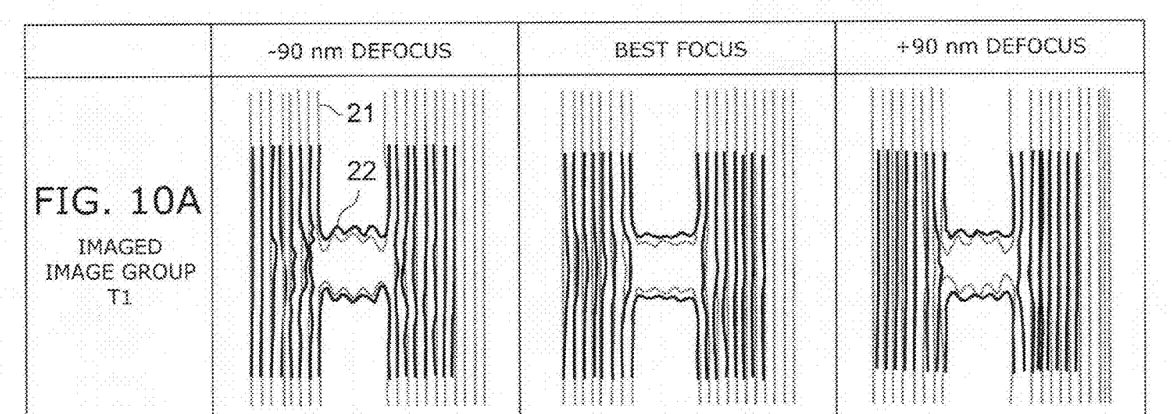
FIGS. 10A and 10B show the outline extracted from the imaged image being superposed on the outline extracted from the reference image.

Next, as shown in step S13 and FIG. 10A, the outline 22 extracted from the imaged image shown in FIG. 9A is superposed on the outline 21 extracted from the reference image shown in FIG. 8. Here, the outlines of the pattern exposed under the same level of exposure condition are superposed on each other. Then, for instance, the magnitude of the difference between the outline 21 and the outline 22 is calculated to compute the matching degree. This matching degree is compared with an appropriate reference value to determine whether the outlines are matched with each other. The matching degree is an index determined based on the magnitude of the difference between the outlines. It is considered that a high matching degree between the outlines indicates similarity between the shapes of the pattern.

Thus, in step S13, one imaged image group is compared with the reference image group. The imaged image group is composed of a plurality of imaged images of the patterns formed by performing lithography under a plurality of levels of exposure condition using one candidate layout. The reference image group is composed of a plurality of reference images produced by simulation on the assumption of a plurality of levels of exposure condition. Thus, it is evaluated whether the characteristic of one candidate layout is in agreement with the simulation. In this embodiment, for convenience of description, it is assumed that the outline 22 of the imaged image group T1 shown in FIGS. 9A and 10A is not matched with the outline 21 of the reference image group R.

Figure 9B:
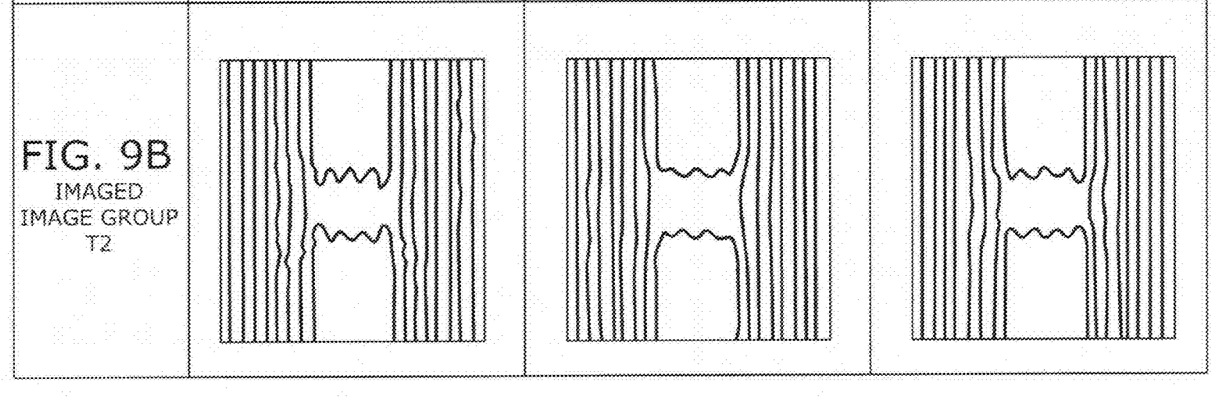
Figure 10B:
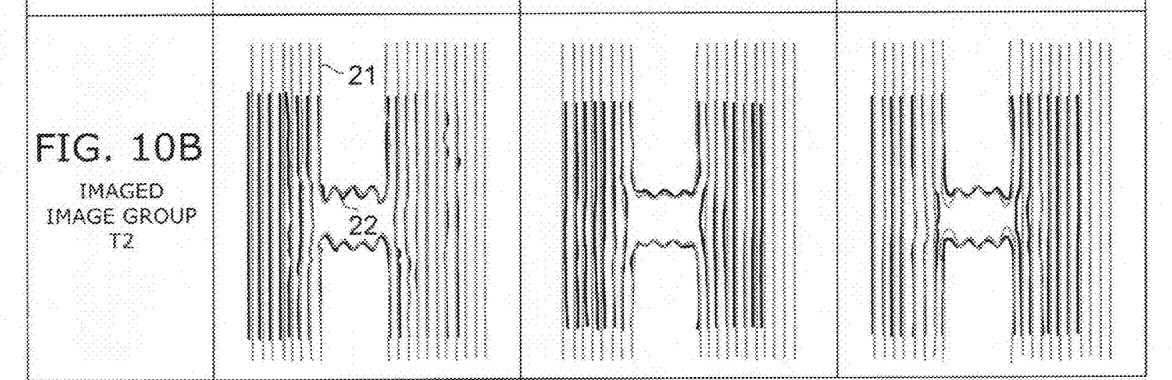

If it is determined in step S13 that the outlines are not matched with each other, the process returns to step S12. Then, as shown in FIG. 9B, an outline 22 is extracted from each imaged image belonging to another imaged image group T2. Next, the process proceeds to step S13. Then, as shown in FIG. 10B, this outline 22 is superposed on the outline 21 of the reference image, and it is determined whether the outlines are matched with each other. In this embodiment, it is assumed that the outline 22 of the imaged image group T2 shown in FIGS. 9B and 10B is matched with the outline 21 of the reference image group R.

If it is determined in step S13 that the outlines are matched with each other, the process proceeds to step S14. Then, the candidate layout for which it is determined that the outline 22 is matched with the outline 21 of the reference image group R is adopted as a final mask layout. In this embodiment, the candidate layout in which the imaged image group T2 is obtained is used as a mask layout. Thus, the mask layout is produced.

Next, the effect of this embodiment is described.

In this embodiment, derived layouts are produced based on the standard layout of the exposure mask (step S4). An evaluation mask is formed based on these layouts (step S5). Patterns are actually formed by performing lithography under a plurality of levels of exposure condition (step S6). Then, these patterns are imaged (step S7) to obtain an imaged image group (step S8). On the other hand, simulation is performed on the assumption of a plurality of levels of exposure condition based on the standard layout (step S9) to obtain a reference image group (step S10). Then, the outline of the imaged image is compared with the outline of the reference image (step S13). The candidate layout of the imaged image group matched with the reference image group is used as a mask layout (step S14).

Thus, in this embodiment, image-to-image comparison is performed between the imaged image of the actually formed pattern and the reference image of the pattern produced by simulation. This allows multifaceted comparison considering more indices than the comparison of the imaged image with numerical specifications. Furthermore, by comparison between sets of a plurality of images corresponding to a plurality of levels of exposure condition, robustness against the variation of exposure condition can also be appropriately evaluated by reference to the simulation result. As a result, a mask layout close to the designed target can be selected.

Furthermore, by extracting outlines from the images and calculating the difference between the outlines, a unique evaluation about the matching between the imaged image and the reference image can be obtained. Thus, the process for selecting a mask layout from candidate layouts shown in steps S11-S13 can be automatically performed by a computer without manual intervention. As a result, according to this embodiment, a mask layout with good characteristic can be produced within a short time. Furthermore, objective and quantitative evaluation can be obtained. Thus, the comparison result can be reflected on the next design of the mask layout. For instance, the comparison result can be fed back to the process for producing a standard layout shown in step S3.

In contrast, a human inspector may view the imaged image and compare it with numerical specifications to evaluate the candidate layout. However, in this case, multifaceted evaluation of the imaged image is difficult. Furthermore, the simulation result is not taken into consideration. Thus, a mask layout may be selected with a viewpoint different from the viewpoint at design time. Furthermore, the evaluation of the candidate layout is close to sensory testing. Thus, the comparison result has poor objectivity and may depend on the subjective determination of the inspector. Furthermore, the comparison result is difficult to feed back to the next design of the mask layout. Moreover, automation is significantly difficult. Thus, the processing speed is low, and the production of the mask layout requires a long time.

In the example of the first embodiment, the imaged image groups are compared one by one with the reference image group, and the comparison is stopped when an imaged image group reaching the acceptance standard has appeared. Thus, typically, there is no need to perform comparison on all the imaged image groups. Accordingly, a mask layout satisfying a prescribed requirement can be produced within a short time. This effect is particularly advantageous in the case where the number of candidate layouts is enormous. In contrast, after all the imaged image groups are compared with the reference image group, the candidate layout with the highest matching degree may be used as a mask layout. In this case, the time required for comparison is longer. However, the best candidate layout can be used as a mask layout.

Next, a second embodiment is described.

In this embodiment, the "darkness" of the patterned region in the optical image is used as an index for producing a standard layout.

Figure 11A:
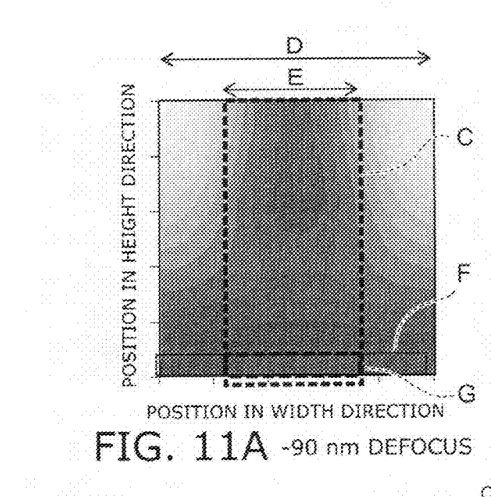
FIGS. 11A to 11C illustrate a light intensity distribution of an optical image imaged in a resist film in a second embodiment, where the horizontal axis represents position in the width direction, and the vertical axis represents position in the height direction.
Figure 11B:
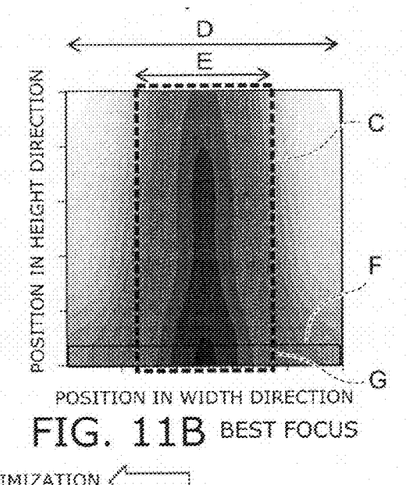
Figure 11C:
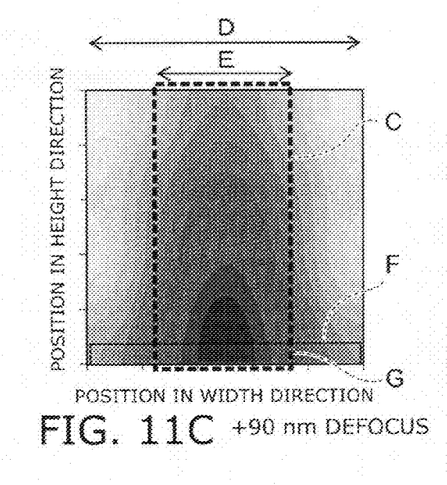

In FIGS. 11A to 11C, region C is a region where a resist pattern is to remain. Length D is the arrangement pitch of a line-and-space pattern. Length E is the width of the region C.

Figure 11D:
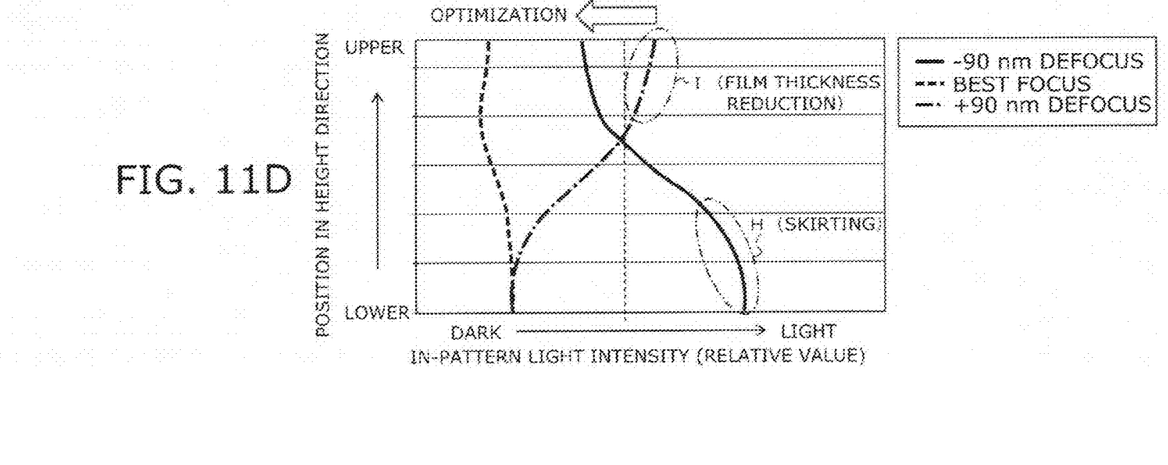
FIG. 11D is a graph illustrating darkness of a region in which the pattern is formed in the resist film, where the horizontal axis represents position in the height direction, and the vertical axis represents the light intensity of the region in which the pattern is formed.

On the vertical axis of FIG. 11D, the value of the ratio of the average value of light intensity in region G to the average value of light intensity in region F is adopted as an index representing the "darkness" of the patterned region in the optical image. A lower value on the vertical axis indicates that the region where the resist pattern is to remain in the resist film is relatively darker. The average value of light intensity in region F can be obtained as follows, for instance. The light intensity at a position in the height direction is integrated over the region F along the width direction and divided by the length in the width direction of the region F. The result can be used as the average value of light intensity in region F. This also applies similarly to the average value of light intensity in region G. However, the index of "darkness" is not limited thereto.

As described above, in this embodiment, when the pattern layout is optimized in the process shown in step S3 of FIG. 1, the "darkness" of the region where the pattern is to be formed in the optical image imaged at exposure time is used as an index for evaluating the mask layout. In actual lithography, this optical image is imaged in the resist film. Then, the resist film of a portion with a darker optical image, i.e., a lower light intensity, is more likely to remain after development. Thus, in order to form a pattern as designed, it is preferable that in the optical image, the region C where the resist pattern is to be left be sufficiently dark, and the other region be sufficiently light.

For instance, as shown in FIG. 11A and range H of FIG. 11D, in the case where the defocus amount of exposure light was −90 nm, the lower portion of the region C was relatively light, and the light intensity difference from the surroundings was small. In this case, if a pattern is formed by lithography, "skirting" occurs, i.e., the skirt spreads.

As shown in FIG. 11C and range I of FIG. 11D, in the case where the defocus amount of exposure light was +90 nm, the upper portion of the region C was relatively light. In this case, if a pattern is formed by lithography, "film thickness reduction" occurs, i.e., the height of the pattern is locally lowered.

In contrast, as shown in FIGS. 11B and 11D, in the case where the exposure light is best focused, the relative value of light intensity represented on the horizontal axis of FIG. 11D was low throughout the height, and the overall region C was sufficiently relatively dark. In this case, the shape of the pattern formed by lithography is favorable. In general, if the relative value of light intensity represented on the horizontal axis of FIG. 11D is higher, the possibility of the occurrence of "skirting" or "film thickness reduction" is higher.

Thus, the "darkness" of the region where the pattern is to be formed in the optical image is used as an index for optimizing the pattern layout. This allows comprehensive evaluation including individual problems such as "skirting" and "film thickness reduction" with regard to the shape of the pattern formed by lithography. Furthermore, the pattern shape can be evaluated more accurately by defining an appropriate cost function using the aforementioned "darkness".

The method and effect of this embodiment other than the foregoing are similar to those of the above first embodiment. In this embodiment, as an index for producing a standard layout, the aforementioned "darkness" may be used in conjunction with the index directly indicating the shape of the pattern used in the first embodiment.

Next, a third embodiment is described.

Figure 12:
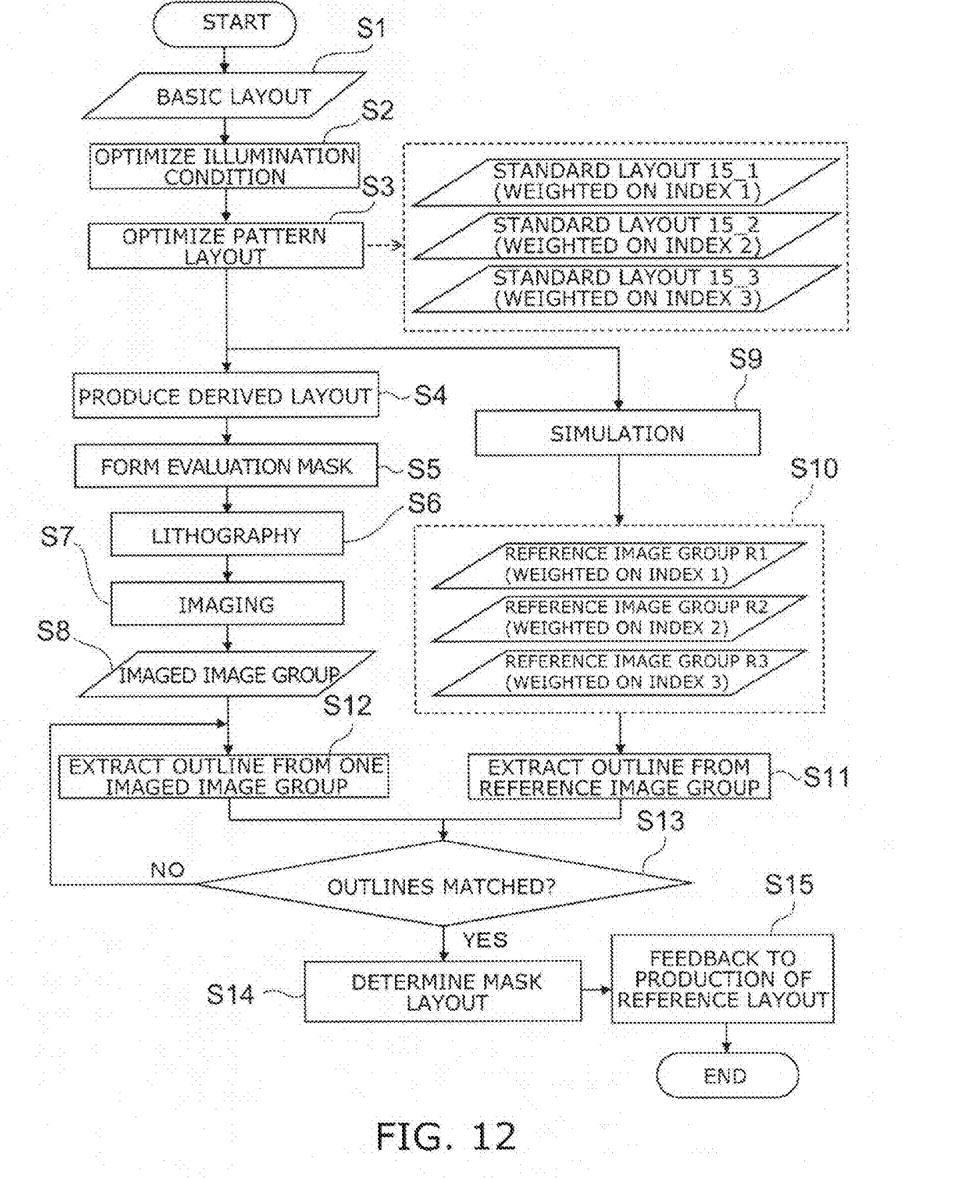
FIG. 12 is a flowchart illustrating a production method for a mask layout according to a third embodiment.

As shown in FIG. 12, in this embodiment, in the optimization of the pattern layout shown in step S3, a plurality of standard layouts 15 weighted on different indices are produced. For instance, three standard layouts, i.e., a standard layout 15_1 weighted on index 1, a standard layout 15_2 weighted on index 2, and a standard layout 15_3 weighted on index 3, are produced.

Then, in steps S4-S8, originating from each of these three standard layouts 15_1-15_3, derived layouts are produced, and an evaluation mask is formed. Patterns are formed by performing lithography under a plurality of levels of exposure condition, and imaged by SEM to obtain an imaged image group. On the other hand, in step S9, simulation is performed on each of the three standard layouts 15_1-15_3. Thus, as shown in step S10, three reference image groups R1-R3 are obtained. Next, in steps S11-S13, the imaged image groups and the reference image groups are compared for each standard layout to select an appropriate mask layout. Thus, the mask layout is produced.

Then, as shown in step S15, the result of selecting the mask layout shown in steps S11-S14 is fed back to the optimization of the pattern layout shown in step S3. For instance, if the characteristic of the mask layout selected using the reference image group R1 is superior to the characteristic of the mask layout selected using the reference image group R2 or R3, then in the next production of a mask layout, a standard layout is produced with higher weight on characteristic 1 than on characteristic 2 and characteristic 3.

According to this embodiment, a plurality of standard layouts 15 weighted on different indices are produced. Thus, a more appropriate mask layout can be produced. Furthermore, knowledge on the index to be weighted can be fed back to the next production of a mask layout. The configuration and effect of this embodiment other than the foregoing are similar to those of the above first embodiment.

Also in this embodiment, after all the imaged image groups are compared with the reference image group, the candidate layout with the highest matching degree of the outline may be selected. Thus, a particularly good mask layout can be produced. Furthermore, the index to be weighted most can be accurately found.

Next, a fourth embodiment is described.

Figure 13:
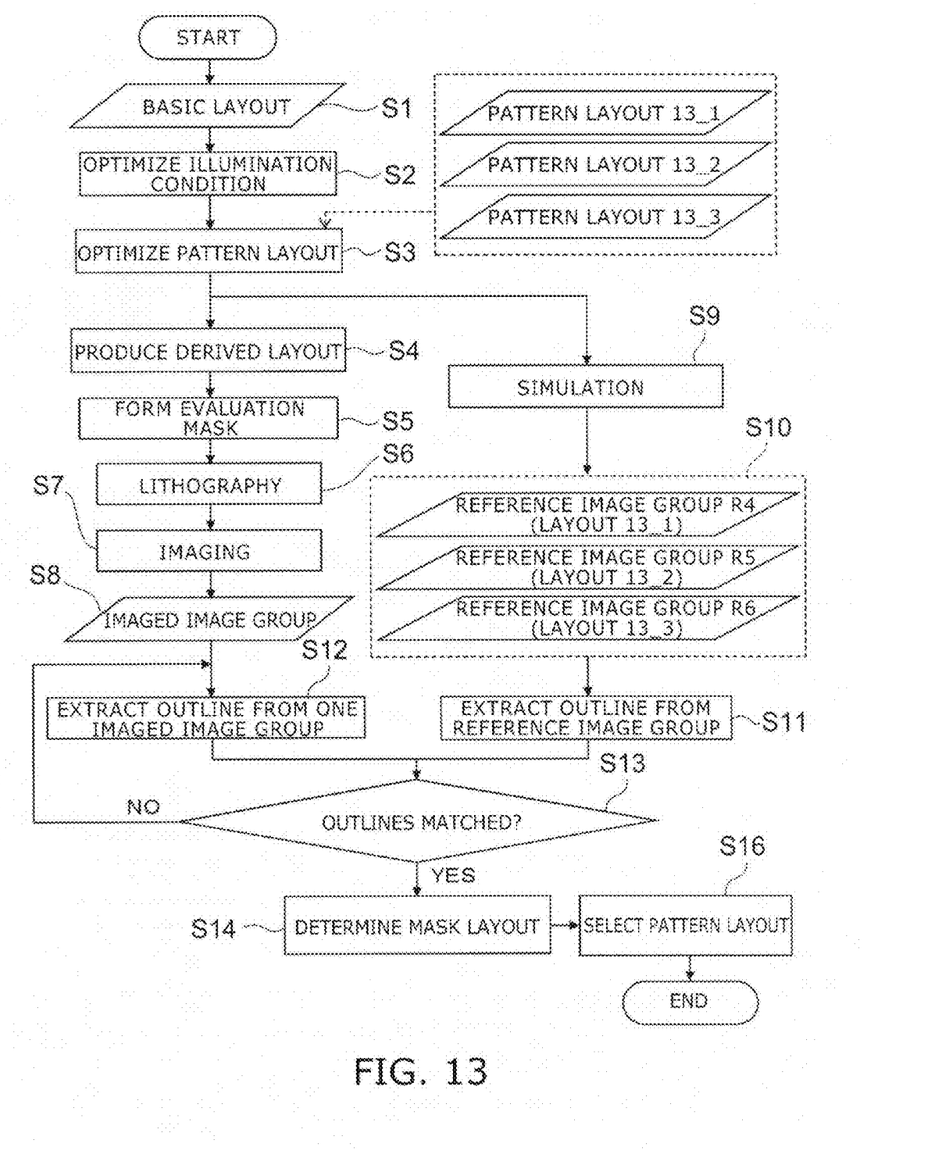
FIG. 13 is a flowchart illustrating a production method for a mask layout according to a fourth embodiment.

As shown in FIG. 13, in this embodiment, a plurality of different pattern layouts, e.g., three pattern layouts 13_1-13_3, are prepared. In the process shown in step S3, each of the three pattern layouts 13_1-13_3 is optimized. Thus, three standard layouts corresponding to the three pattern layouts 13_1-13_3 are produced.

Then, in steps S4-S8, originating from each of these three standard layouts, an imaged image group is obtained. On the other hand, in step S9, simulation is performed on each of the three standard layouts. Thus, as shown in step S10, three reference image groups R4-R6 are obtained. Next, in steps S11-S13, the imaged image groups and the reference image groups are compared based on each standard layout for each pattern layout. Thus, in step S14, an appropriate candidate layout is selected. Thus, the mask layout is produced.

Then, as shown in step S16, the pattern layout 13 from which the candidate layout selected in step S14 originates is adopted as a pattern layout to be formed in an integrated circuit device.

According to this embodiment, a plurality of standard layouts 15 are produced based on a plurality of different pattern layouts. Thus, a more appropriate mask layout can be produced. Furthermore, from a plurality of candidates of pattern layouts, a pattern layout more suitable for lithography can be selected. This embodiment is particularly effective in the case where e.g. part of the pattern layout may be determined depending on lithography.

Also in this embodiment, after all the imaged image groups are compared with the reference image group, the candidate layout with the highest matching degree of the outline may be selected. Thus, a pattern layout most suitable for lithography can be reliably found.

Next, a fifth embodiment is described.

This embodiment is an embodiment of an evaluation apparatus for automatically performing the process shown in steps S11-S13 in the above first to fourth embodiments.

Figure 14:
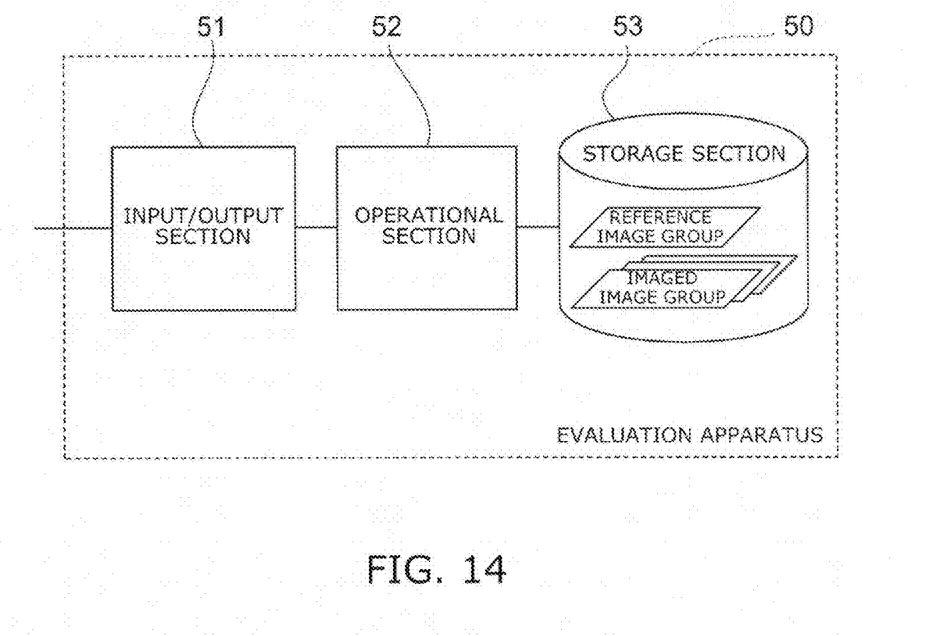
FIG. 14 is a block diagram illustrating an evaluation apparatus according to a fifth embodiment.

As shown in FIG. 14, the evaluation apparatus 50 according to this embodiment includes an input/output section 51, an operational section 52, and a storage section 53.

The input/output section 51 receives external input of a reference image group and an imaged image group. Furthermore, the input/output section 51 outputs the selection result of the operational section 52. For instance, the input/output section 51 includes a LAN (local area network) connector, a USB (Universal Serial Bus) connector, an optical disk drive such as DVD (Digital Versatile Disc) drive, a display, a keyboard, and a mouse.

The operational section 52 extracts respective outlines from the reference image and the imaged image. The operational section 52 calculates the difference between the outlines and computes the matching degree between the outlines. By comparing this matching degree with a reference value, the operational section 52 determines whether the outlines are matched with each other. For instance, the operational section 52 includes a CPU (central processing unit).

The storage section 53 stores the reference image group and the imaged image group inputted from the input/output section 51, and the extracted outlines, the calculated matching degree, the determination result and the like of the operational section 52. For instance, the storage section 53 includes a HDD (hard disk drive).

As shown in step S8 of FIG. 1, the evaluation apparatus 50 retrieves an imaged image group by the input/output section 51 and stores it in the storage section 53. As shown in step S10, the evaluation apparatus 50 retrieves a reference image group by the input/output section 51 and stores it in the storage section 53. Next, as shown in step S11, the operational section 52 reads each reference image of the reference image group from the storage section 53 and extracts an outline 21. As shown in step S12, the operational section 52 reads each imaged image of the imaged image group from the storage section 53 and extracts an outline 22. Next, as shown in step S13, the operational section 52 calculates the difference between the outline 21 and the outline 22 to compute a matching degree. The operational section 52 compares the matching degree with a reference value and determines whether the outlines are matched with each other. Then, the operational section 52 externally outputs this determination result via the input/output section 51.

Thus, the image comparison apparatus according to this embodiment can automatically perform the processing shown in steps S8-S13. The method and effect of this embodiment other than the foregoing are similar to those of the above first embodiment.

The evaluation apparatus 50 may be implemented by controlling a general-purpose personal computer using a prescribed program. The program used in this case is an evaluation program for causing a computer to execute a procedure for evaluating candidate layouts by comparison between the imaged image group and the reference image group. The imaged image group is composed of a plurality of imaged images of patterns formed by performing lithography under a plurality of levels of exposure condition using the candidate layouts. The reference image group is composed of a plurality of reference images produced by simulation on the assumption of a plurality of levels of exposure condition.

In the examples of the above first to fourth embodiments, the defocus amount is used as the exposure condition varied in a plurality of levels in lithography (step S6) and simulation (step S9). However, the embodiments are not limited thereto. For instance, the dose amount of exposure light may be alternatively used.

In the examples of the above first to fifth embodiments, outlines of patterns are extracted from the imaged image and the reference image and compared with each other. However, the embodiments are not limited thereto. For instance, contours (level curves) of patterns may be extracted and compared with each other. In this case, even if the imaged image is a top view image of the pattern imaged from directly above, the side surface of the pattern is typically inclined so that the lower portion spreads. Thus, the information on the side surface of the pattern can be read to some extent from the imaged image. Accordingly, the contour of the pattern can be estimated.

The embodiments described above can realize a production method, an evaluation apparatus, and an evaluation program for a mask layout enabling efficient production of a good mask layout.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A production method for a mask layout of an exposure mask, comprising:
evaluating a candidate layout by comparison between an imaged image group and a reference image group, the imaged image group being composed of a plurality of imaged images of patterns formed by performing lithography under a plurality of levels of exposure condition using the candidate layout, and the reference image group being composed of a plurality of reference images produced by simulation on assumption of a plurality of levels of the exposure condition.

2. The method according to claim 1, wherein the plurality of levels in the simulation are matched with the plurality of levels in the lithography.

3. The method according to claim 1, wherein the exposure condition is defocus amount at the exposure.

4. The method according to claim 1, wherein the exposure condition is dose amount of exposure light.

5. The method according to claim 1, wherein the evaluating includes calculating difference between an outline extracted from the imaged image and an outline extracted from the reference image.

6. A production method for a mask layout of an exposure mask, comprising:
producing a standard layout of the exposure mask based on a layout of a pattern to be formed;
producing a derived layout in which a subset of parameters representing the standard layout is varied;
forming an evaluation masks each having the standard layout and the derived layout;
forming a plurality of patterns by performing lithography using the evaluation masks with an exposure condition varied in a plurality of different levels;
obtaining an imaged image group composed of a plurality of imaged images corresponding to the plurality of levels for each of the standard layout and the derived layout by imaging the patterns;
obtaining a reference image group composed of a plurality of reference images corresponding to the plurality of levels by performing simulation on assumption of a plurality of different levels of the exposure condition for the standard layout; and
evaluating the standard layout or the derived layout corresponding to at least one of the imaged image groups by comparison between the reference image group and the at least one imaged image group.

7. The method according to claim 6, wherein
the producing a standard layout includes:
modifying a pattern layout of the pattern to be formed; and calculating a value of an index by simulation on assumption of the modified pattern layout, and the standard layout is determined based on the value of the index.

8. The method according to claim 7, wherein darkness of a region where the pattern is to be formed in an optical image imaged at exposure time is used as the index.

9. The method according to claim 7, wherein a parameter representing shape of the pattern is used as the index.

10. The method according to claim 7, wherein in the producing a standard layout, a plurality of standard layouts weighted on different ones of the indices are produced.

11. The method according to claim 6, wherein in the producing a standard layout, a plurality of standard layouts based on different layouts of the pattern are produced.

\* \* \* \* \*